US007113005B2

(12) United States Patent
Ono et al.

(10) Patent No.: US 7,113,005 B2
(45) Date of Patent: Sep. 26, 2006

(54) CURRENT MIRROR CIRCUIT

(75) Inventors: Akihiro Ono, Kyoto (JP); Akira Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 214 days.

(21) Appl. No.: 10/943,239

(22) Filed: Sep. 17, 2004

(65) Prior Publication Data

US 2005/0068093 A1 Mar. 31, 2005

(30) Foreign Application Priority Data

Sep. 26, 2003 (JP) ............................ 2003-335693

(51) Int. Cl.
*G01R 19/00* (2006.01)

(52) U.S. Cl. .......................... 327/53; 327/66; 327/538; 327/543; 330/288; 323/303; 323/313

(58) Field of Classification Search .................... None
See application file for complete search history.

(56) References Cited

U.S. PATENT DOCUMENTS

| | | | | |
|---|---|---|---|---|
| 4,550,284 | A * | 10/1985 | Sooch | 323/315 |
| 5,399,914 | A * | 3/1995 | Brewster | 327/538 |
| 5,614,850 | A * | 3/1997 | Corsi et al. | 327/55 |
| 5,808,508 | A * | 9/1998 | Castellucci et al. | 327/538 |
| 6,342,781 | B1 * | 1/2002 | Laraia | 323/313 |
| 6,467,611 | B1 * | 10/2002 | Ambs et al. | 198/716 |
| 6,657,481 | B1 * | 12/2003 | Rasmussen et al. | 327/540 |
| 6,756,840 | B1 * | 6/2004 | Zabroda | 327/538 |
| 6,803,808 | B1 * | 10/2004 | Wu | 327/538 |
| 6,956,428 | B1 * | 10/2005 | Voo | 327/538 |
| 7,009,452 | B1 * | 3/2006 | Grilo | 330/288 |
| 2001/0033194 | A1 * | 10/2001 | Ono et al. | 327/538 |
| 2005/0231273 | A1 * | 10/2005 | Whittaker | 327/543 |

FOREIGN PATENT DOCUMENTS

| | | |
|---|---|---|
| JP | 06-112740 | 4/1994 |
| JP | 07-231229 | 8/1995 |

* cited by examiner

*Primary Examiner*—Tuan T. Lam
*Assistant Examiner*—Hiep Nguyen
(74) *Attorney, Agent, or Firm*—Arent Fox PLLC

(57) ABSTRACT

The present invention provides a current mirror circuit of which consistency (ratio) of the input current and output current is more improved. This current mirror circuit comprises input side and output side bi-polar transistors of which bases are commonly connected, an input side MOS transistor of which source is connected to a collector of the input side bi-polar transistor and of which drain and gate are connected to the input terminal, output side MOS transistors of which source is connected to the collectors of the output side bi-polar transistors, of which drain is connected to the output terminals, and of which gate is connected to the gate of the input side MOS transistor, and an MOS transistor for supplying base current of which source is connected to the bases of the input side and output side bi-polar transistors, and of which gate is connected to the gate of the input side MOS transistor.

4 Claims, 3 Drawing Sheets

CURRENT MIRROR CIRCUIT

BACKGROUND OF THE INVENTION

1. Field of the Invention

The present invention relates to a current mirror circuit, more particularly to a current mirror circuit suitable for constructing a current mirror circuit using a Bi-CMOS process, which allows mounting CMOS transistors and bi-polar (BIP) transistors on a same semiconductor integrated circuit.

2. Description of the Related Art

A current mirror circuit, which is constructed using a bi-polar (BIP) process, has been widely used for electronic circuits to implement various functions, since the output current, which is in proportion to the input current at a predetermined ratio, can be acquired in a small area at high precision. FIG. 5 shows an example of a current mirror circuit (e.g. Japanese Patent Application Laid-Open No. H06-112740). This current mirror circuit 101, where the input current $I_0$ is input to an input terminal IN, and the output currents $I_1$ and $I_2$ are output to two output terminals, OUT1 and OUT2, is comprised of four NPN type BIP transistors. Specifically, for both the input side BIP transistor 110, of which collector is connected to the input terminal IN, and the output side BIP transistors 111 and 112, of which collectors are connected to the two output terminals OUT1 and OUT2, the respective emitter is grounded and a base is commonly connected. For the BIP transistor for supplying base current 113, of which the collector is connected to the power supply VCC, the emitter is connected to the base of the input side and the output side BIP transistors 110, 111 and 112, and the base is connected to the input terminal IN. In this case, the sizes of the output side BIP transistors 111 and 112 are set to be a predetermined scale factor respectively compared with the input side BIP transistor 110, so that the required output currents $I_1$ and $I_2$ can be acquired respectively. In this current mirror circuit 101, current branching from the input current $I_0$ becomes the base current of the BIP transistor for supplying base current 113, and current, when this base current is amplified with the emitter ground amplification factor ($h_{FE}$), becomes the total current $I_B$ of the base currents $I_{B0}$, $I_{B1}$ and $I_{B2}$ of the input side and output side BIP transistors 110, 111 and 112. Therefore current branching from the input current $I_0$, for the base current of the input side and output side BIP transistors 110, 111 and 112, can be small, which can decrease errors in the consistency (ratio) of the input current $I_0$ and the output currents $I_1$ and $I_2$.

FIG. 6 shows an example of another current mirror circuit (e.g. Japanese Patent Application Laid-Open No. H07-231229). In the current mirror circuit 102, just like the above mentioned prior art, emitters of the input side and output side BIP transistors 110, 111 and 112 are all grounded and the bases thereof are commonly connected. Each of these bases, in this case, is connected to the collector of the output side BIP transistor 111. And the emitters of the input side and output side BIP transistors 114, 115 and 116 are connected to the collectors of the BIP transistors 110, 111 and 112 respectively, and collectors thereof are connected to the input terminal IN and the output terminals OUT1 and OUT2 respectively, and the bases are commonly connected and are also connected to the input terminal IN. This current mirror circuit 102 can fix the collectors of the BIP transistors 110, 111 and 112 to roughly the same potential (that is base potentials of these). The influence of the dependency of the BIP transistors 110, 111 and 112 on the collector potential, that is the influence of Early effect, can be controlled, which can decrease the errors in consistency (ratio) of the input current $I_0$ and output currents $I_1$ and $I_2$.

SUMMARY OF THE INVENTION

The above mentioned current mirror circuit can considerably decrease the errors in consistency (ratio) of the input current $I_0$ of the input terminal IN and output currents $I_1$ and $I_2$ of the output terminals OUT1 and OUT2. However further improvements in consistency (ratio) is demanded for current mirror circuits, and specifically further decreases in the current that branches from the input current for the base current and a suppression of the influence of Early effect are demanded.

With the foregoing in view, it is an object of the present invention to provide a current mirror circuit where current branching from the input current for the base current is further decreased, and the influence of Early effect is suppressed, so as to further improve the consistency (ratio) of the input current and the output current.

To solve the above problem, the current mirror circuit according to the present invention is a current mirror circuit for inputting input current to an input terminal and outputting output current to an output terminal, comprising: an input side and output side bi-polar transistors of which bases are commonly connected; an input side MOS transistor of which source is connected to a collector of the input side bi-polar transistor and of which drain and gate are connected to the input terminal; an output side MOS transistor of which source is connected to a collector of the output side bi-polar transistor, of which drain is connected to the output terminal, and of which gate is set to a potential substantially the same as the gate of the input side MOS transistor; and an MOS transistor for supplying base current of which source is connected to the bases of the input side and output side bi-polar transistors and of which gate is connected to the gate of the input side MOS transistor.

The current mirror circuit according to the present invention, which has a circuit configuration in which MOS transistors and BIP transistors are combined, can eliminate current which branches from the input current to the bases of the input side and output side bi-polar transistors and suppress the influence of Early effect at the input side and output side bi-polar transistors, therefore the errors in the consistency (ratio) of the input current and output current can be further decreased.

DESCRIPTION OF THE PREFERRED EMBODIMENTS

Figure 1:
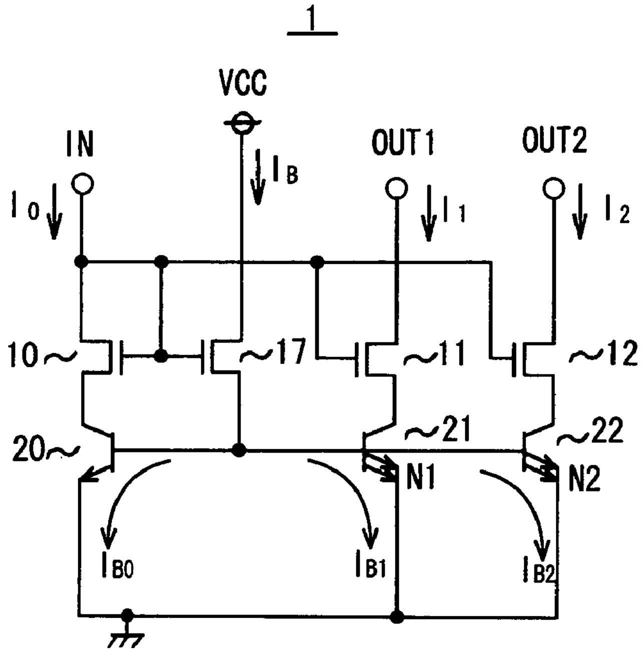
FIG. 1 is a circuit diagram depicting a current mirror circuit according to an embodiment of the present invention.

Preferred embodiments of the present invention will now be described with reference to the drawings. FIG. 1 is a circuit diagram of the current mirror circuit according to an embodiment of the present invention. This current mirror circuit 1 is for inputting the input current $O_0$ to an input terminal IN and outputting the output currents $I_1$ and $I_2$ to two output terminals OUT1 and OUT2, and comprises four N-type MOS transistors and three NPN-type bi-polar (BIP) transistors. Specifically, the bases of the input side and the two output side BIP transistors 20, 21 and 22 are commonly connected, and the emitters thereof are all grounded. The source of the input side MOS transistor 10 is connected to the collector of the input side BIP transistor 20, and the drain and gate thereof are connected to the input terminal IN. The sources of the two output side MOS transistors 11 and 12 are connected to the respective collectors of the output side BIP transistors 21 and 22, and the drains thereof are connected to the output terminals OUT1 and 0UT2 respectively, and the gates thereof are connected to the gate of the input side MOS transistor 10. Therefore the gates of the two output side MOS transistors 11 and 12 have substantially the same potential as the gate of the input side MOS transistor 10. The source of the MOS transistor for supplying base current 17 is connected to the bases of the input side and output side bi-polar transistors 20, 21 and 22, the gate thereof is connected to the gate of the input side MOS transistor 10, and the drain thereof is connected to the power supply VCC. In this case, the sizes of the output side BIP transistors 21 and 22 are set to be N1 times and N2 times (N1 and N2 are positive real numbers) of the input side BIP transistor 20 respectively, so that the output currents $I_1$ and $I_2$ of the output terminals OUT1 and OUT2 become about N1 times and N2 times of the input current $I_0$ of the input terminal IN respectively. The drain of the MOS transistor for supplying base current 17 need not be connected directly to the power supply VCC only if the total current $I_B$ of the base current $I_{B0}$, $I_{B1}$ and $I_{B2}$ of the input side and output side BIP transistors 20, 21 and 22 can be supplied.

In this current mirror circuit 1, the bases of the input side and output side BIP transistors 20, 21 and 22 have a potential higher than the ground potential by the amount of forward bias voltage (Vf) between base and emitter. And the gate of the MOS transistor for supplying base current 17 has a potential higher than the bases of the input side and output side BIP transistors 20, 21 and 22 by the amount of voltage corresponding to the current $I_B$ which flows through the drain. Then the collector of the input side BIP transistor 20 is fixed to a potential lower than the gate of the input side MOS transistor 10, that is the gate of the MOS transistor for supplying base current 17 by the amount of voltage corresponding to the current $I_0$ which flows through the drain of the input side MOS transistor 10. The collector of the output side BIP transistor 21 is fixed to a potential lower than the gate of the output side MOS transistor 11, that is the gate of the MOS transistor for supplying base current 17 for the amount of the voltage corresponding to the current $I_1$ which flows through the drain of the output side MOS transistor 11. In the same way, the collector of the output side BIP transistor 22 is fixed to a potential lower than the gate of the MOS transistor for supplying base current 17 by the amount of voltage corresponding to the current $I_2$ which flows through the drain of the output side MOS transistor 12.

Important here is that the collectors of the output side BIP transistors 21 and 22 can be set to a potential roughly equal to the collector of the input side BIP transistor 20 by setting the sizes of the output side MOS transistors 11 and 12 to N1 times and N2 times of the input side MOS transistor 10 respectively. By this, a deviation of characteristics between the input side and output side BIP transistors 20, 21 and 22, caused by Early effect, can be prevented, and as a result, the consistency (ratio) of the input current $I_0$ and output currents $I_1$ and $I_2$ can be further improved. Also by matching the size ratio of the MOS transistor for supplying base current 17 and the input side MOS transistor 10 to the ratio of the current $I_B$ that flows through the drain of the MOS transistor for supplying base current 17 and the current $I_0$ which flows through the drain of the input side MOS transistor 10, the collector potential of the input side BIP transistor 20 (that is the collector potential of the output side BIP transistors 21 and 22) can be set to roughly the same as the base potential of the input side and output side BIP transistors 20, 21 and 22. By this, the generation of Early effect itself can be suppressed. The absolute size of these MOS transistors 10, 11, 12 and 17, which has little influence on the consistency (ratio), can be set relatively small.

Now the function of the MOS transistor for supplying base current 17 will be further described. The base currents $I_{B0}$, $I_{B1}$ and $I_{B2}$ of the input side and output side BIP transistors 20, 21 and 22 are supplied respectively only from the current $I_B$ which flows through the drain of the MOS transistor for supplying base current 17. In other words, no current is branched from the input current $I_0$ and becomes a part of the base currents $I_{B0}$, $I_{B1}$, and $I_{B2}$. Therefore the input current $I_0$ accurately becomes the current that flows through the collector of the input side BIP transistor 20, and as a result, the output currents $I_1$ and $I_2$ become very accurately N1 times and N2 times of the input current $I_0$.

It is also possible to increase the output terminals by disposing an extra BIP transistor in parallel with the output side BIP transistors 21 and 22, or if not necessary, the output side BIP transistor 22 (and output side MOS transistor 12) can be omitted, and only one output terminal can be used.

Figure 2:
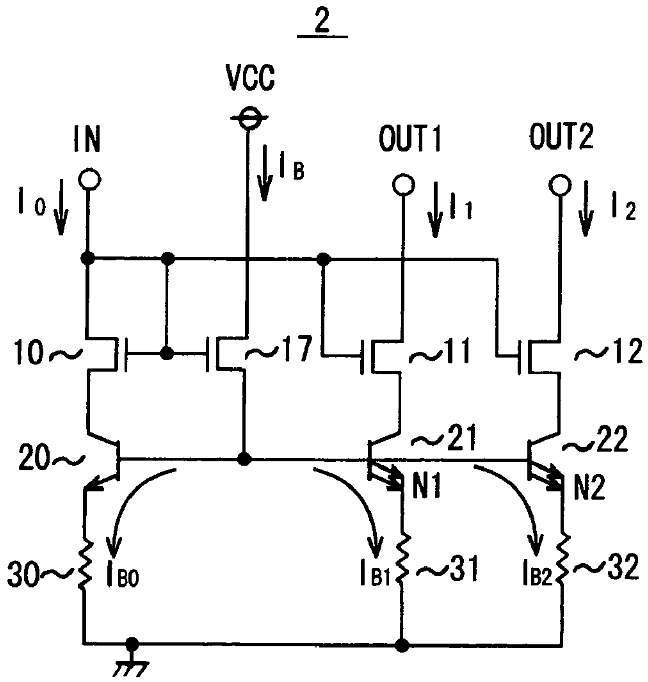
FIG. 2 is a modified circuit diagram of the above circuit diagram in FIG. 1.

Needless to say, the resistors 30, 31 and 32 can be inserted between the BIP transistors 20, 21 and 22 and the ground potential respectively, as shown in the current mirror circuit 2 in FIG. 2, so as to minimize the influence of characteristic dispersion among the input side and output side BIP transistors 20, 21 and 22.

Figure 3:
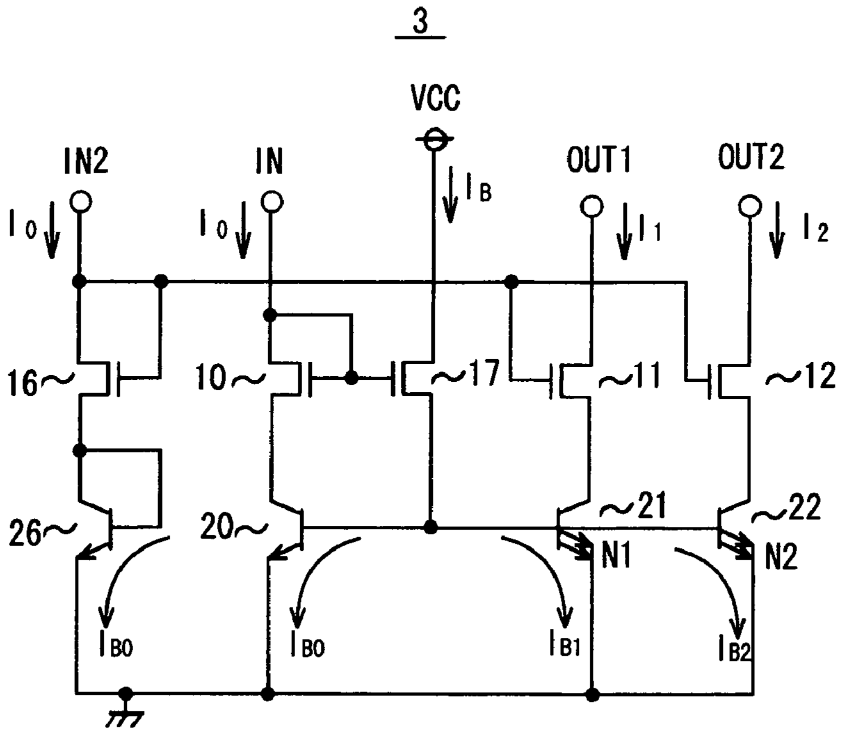
FIG. 3 is a circuit diagram of a current mirror circuit according to another embodiment of the present invention.

FIG. 3 shows the case when the current mirror circuit 1 is modified to be one that supports high frequency. This current mirror circuit 3 has another second input terminal IN2, and comprises an N-type second input side MOS transistor 16 of which drain and gate are connected to this second input terminal IN2, and an NPN-type second input side BIP transistor 26 of which collector and base are connected to the source of this second input side MOS transistor 16, and of which emitter is grounded, separately from the composing elements of the above mentioned current mirror circuit 1. The gates of the output MOS transistors 11 and 12 are not connected to the gate of the input side MOS transistor 10, but are connected to the gate of the second input side MOS transistor 16. The sizes of the second input side MOS transistors 16 and the second input side BIP transistor 26 are set to roughly the same as those of the input side MOS transistor 10 and the input side BIP transistor 20 respectively, and the gate of the second input side MOS transistor 16 and the gate of the input side MOS transistor 10 can be set to substantially the same potential by flowing the input current $I_0$, which is the same as the current of the input terminal IN, to the second input terminal IN2. If a high frequency signal is superimposed onto the output terminals OUT1 and OUT2, this current mirror circuit 3 blocks this from being fed back to the input current of the input terminal IN, even if the input current of the second input terminal IN2 is influenced, which can prevent problems, such as oscillation, from occurring.

The current mirror circuits 1, 2 and 3 can be fabricated by the Bi-CMOS process, where a CMOS and BIP can be mounted on the same semiconductor integrated circuit.

Figure 4:
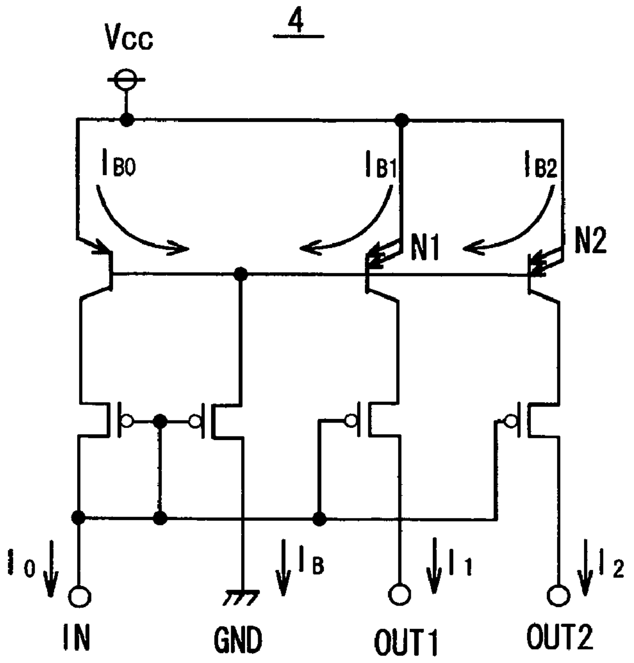
FIG. 4 is a circuit diagram of a current mirror circuit according to still another embodiment of the present invention.
Figure 5:
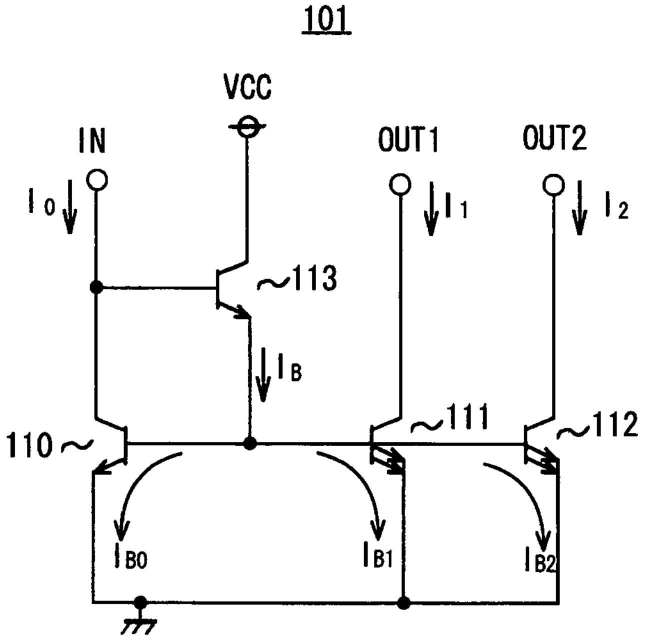
Fig. 5 ( Prior art )
FIG. 5 is a circuit diagram of a current mirror circuit according to a prior art.
Figure 6:
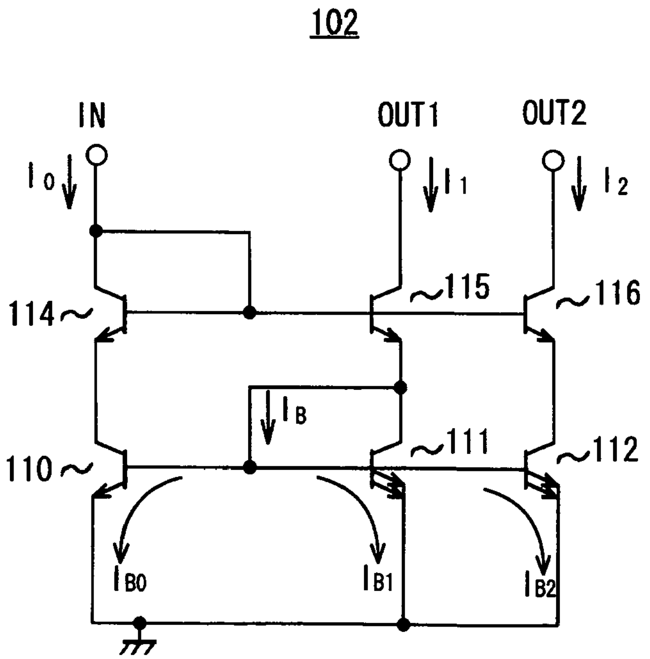
Fig. 6 ( Prior art )
FIG. 6 is a circuit diagram of another current mirror circuit according to a prior art.

The current mirror circuit in the case when the input current and output current flow into the ground potential was described above, but a current circuit in the case when the input current and output current flow out of the power supply (VCC) can also be constructed in the same way. The current mirror circuit 4 shown in FIG. 4 corresponds to the above mentioned current mirror circuit 1, but the NPN-type BIP transistors connected to the ground potential in the current mirror circuit 1 are replaced with the PNP-type BIP transistors connected to the power supply (VCC), and the N-type MOS transistors are replaced with the P-type MOS transistors. In this way, in the case when the input current and output current flow out of the power supply (VCC) as well, errors in consistency (ratio) of the input current and output current can be further decreased.

The present invention is not limited to the above embodiments, but the design thereof can be modified in various ways within the scope of the issues stated in the Claims.

What is claimed is:

1. A current mirror circuit for inputting input current to an input terminal and outputting output current to an output terminal, comprising:

input side and output side bi-polar transistors of which bases are commonly connected;

an input side MOS transistor of which source is connected to a collector of the input side bi-polar transistor and of which drain and gate are connected to the input terminal;

an output side MOS transistor of which source is connected to a collector of the output side bi-polar transistor, of which drain is connected to the output terminal, and of which gate is set to a potential substantially the same as the gate of the input side MOS transistor; and an MOS transistor for supplying base current, of which source is connected to the bases of the input side and output side bi-polar transistors, and of which gate is connected to the gate of the input side MOS transistor.

2. The current mirror circuit according to claim 1, wherein the gate of the output side MOS transistor is connected to the gate of the input side MOS transistor such that the two gates have the substantially same potential.

3. The current mirror circuit according to claim 1, wherein the size ratio of the input side MOS transistor and the output side MOS transistor is matched to the size ratio of the input side bi-polar transistor and the output side bi-polar transistor.

4. The current mirror circuit according to claim 3, wherein the size ratio of the MOS transistor for supplying base current and the input side MOS transistor is matched to the ratio of the current that flows through the drain of the MOS transistor for supplying base current and the current that flows through the drain of the input side MOS transistor.

* * * * *